US008278674B2

(12) United States Patent
Krames et al.

(10) Patent No.: US 8,278,674 B2
(45) Date of Patent: *Oct. 2, 2012

(54) LUMINESCENT CERAMIC ELEMENT FOR A LIGHT EMITTING DEVICE

(75) Inventors: Michael R. Krames, Los Altos, CA (US); Peter J. Schmidt, Aachen (DE)

(73) Assignees: Philips Lumileds Lighting Company LLC, San Jose, CA (US); Koninklijke Philips Electronics N.V., Eindhoven (NL)

( * ) Notice: Subject to any disclaimer, the term of this patent is extended or adjusted under 35 U.S.C. 154(b) by 208 days.

This patent is subject to a terminal disclaimer.

(21) Appl. No.: 12/390,564

(22) Filed: Feb. 23, 2009

(65) Prior Publication Data
US 2009/0155943 A1  Jun. 18, 2009

Related U.S. Application Data

(62) Division of application No. 11/290,299, filed on Nov. 29, 2005, now Pat. No. 7,514,721.

(51) Int. Cl.
H01L 33/00  (2010.01)

(52) U.S. Cl. ...... 257/98; 257/94; 257/103; 257/E33.001

(58) Field of Classification Search ............ 257/94, 257/98, 103
See application file for complete search history.

(56) References Cited

U.S. PATENT DOCUMENTS

| | | | |
|---|---|---|---|
| 4,940,854 A | 7/1990 | Debe | |
| 5,123,074 A | 6/1992 | Yokota et al. | |
| 6,351,069 B1 | 2/2002 | Lowery et al. | |
| 6,576,488 B2 | 6/2003 | Collins, III et al. | |
| 6,630,691 B1 | 10/2003 | Mueller-Mach et al. | |
| 6,650,044 B1 | 11/2003 | Lowery | |
| 6,696,703 B2 | 2/2004 | Mueller-Mach et al. | |
| 7,341,878 B2 * | 3/2008 | Krames et al. | 438/22 |
| 7,361,938 B2 | 4/2008 | Mueller et al. | |
| 2003/0094896 A1 | 5/2003 | Valentine et al. | |
| 2003/0160259 A1 | 8/2003 | Uemura | |
| 2004/0027062 A1 | 2/2004 | Shiang et al. | |
| 2004/0104672 A1 | 6/2004 | Shiang et al. | |

(Continued)

FOREIGN PATENT DOCUMENTS
EP  1588991 A  10/2005

OTHER PUBLICATIONS

Gerd O Mueller et al., U.S. Appl. No. 10/861,172, filed: Mar. 14, 2005, entitled: "Luminescent Ceramic For A Light Emitting Device", 20 pages.

Gerd O Mueller et al., U.S. Appl. No. 11/080,801, filing date: Jun. 3, 2004, entitled: "Wavelength-Converted Semiconductor Light Emitting Device".

Jan Haisma et al., Contact bonding, including direct-bonding in a historical and recent context of materials science and technology, physics and chemistry, Historical review in a broader scope and comparative outlook, Materials Science and Engineering R 37 (2002) 1-50, pp. 1-60.

(Continued)

Primary Examiner — Wai Sing Louie

(57) ABSTRACT

A semiconductor structure including a light emitting layer disposed between an n-type region and a p-type region is attached to a compound substrate including a host which provides mechanical support to the device and a ceramic layer including a luminescent material. In some embodiments the compound substrate includes a crystalline seed layer on which the semiconductor structure is grown. The ceramic layer is disposed between the seed layer and the host. In some embodiments, the compound substrate is attached to the semiconductor structure after growth of the structure on a conventional growth substrate. In some embodiments, the compound substrate is spaced apart from the semiconductor structure and does not provide mechanical support to the structure. In some embodiments, the ceramic layer has a thickness less than 500 μm.

8 Claims, 6 Drawing Sheets

U.S. PATENT DOCUMENTS

| | | |
|---|---|---|
| 2004/0140765 A1 | 7/2004 | Takekuma |
| 2004/0145308 A1 | 7/2004 | Rossner et al. |
| 2005/0132950 A1 | 6/2005 | Kim et al. |
| 2005/0269582 A1 | 12/2005 | Mueller |
| 2006/0202105 A1 | 9/2006 | Krames et al. |
| 2008/0142779 A1* | 6/2008 | Yang .............................. 257/13 |

OTHER PUBLICATIONS

"Transfers of 2-Inch Gan Films Onto Saphire Substrates . . ." Tauzin et al, Electronics Letters IEE Stevenage vol. 41, No. 11, May 26, 2005, p. 668-670.

* cited by examiner

LUMINESCENT CERAMIC ELEMENT FOR A LIGHT EMITTING DEVICE

CROSS REFERENCE TO RELATED APPLICATIONS

This application is a division of application Ser. No. 11/290,299, filed Nov. 29, 2005 and incorporated herein by reference.

BACKGROUND

1. Field of Invention

This invention relates to wavelength converting members suitable for use with semiconductor light emitting devices such as light emitting diodes.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since the light emitted by III-nitride devices is generally on the shorter wavelength end of the visible spectrum, the light generated by III-nitride devices can be readily converted to produce light having a longer wavelength. It is well known in the art that light having a first peak wavelength (the "primary light") can be converted into light having a longer peak wavelength (the "secondary light") using a process known as luminescence/fluorescence. The fluorescent process involves absorbing the primary light by a wavelength-converting material such as a phosphor, exciting the luminescent centers of the phosphor material, which emit the secondary light. The peak wavelength of the secondary light will depend on the phosphor material. The type of phosphor material can be chosen to yield secondary light having a particular peak wavelength.

With reference to FIG. 1, a prior art phosphor-converted LED 10 described in U.S. Pat. No. 6,351,069 is shown. The LED 10 includes a III-nitride die 12 that generates blue primary light when activated. The III-nitride die 12 is positioned on a reflector cup lead frame 14 and is electrically coupled to leads 16 and 18. The leads 16 and 18 conduct electrical power to the III-nitride die 12. The III-nitride die 12 is covered by a layer 20, often a transparent resin, that includes wavelength-converting material 22. The type of wavelength-converting material utilized to form the layer 20 can vary, depending upon the desired spectral distribution of the secondary light that will be generated by the fluorescent material 22. The III-nitride die 12 and the fluorescent layer 20 are encapsulated by a lens 24. The lens 24 is typically made of a transparent epoxy or silicone.

In operation, electrical power is supplied to the III-nitride die 12 to activate the die. When activated, die 12 emits the primary light away from the top surface of the die. A portion of the emitted primary light is absorbed by the wavelength-converting material 22 in the layer 20. The wavelength-converting material 22 then emits secondary light, i.e., the converted light having a longer peak wavelength, in response to absorption of the primary light. The remaining unabsorbed portion of the emitted primary light is transmitted through the wavelength-converting layer, along with the secondary light. The lens 24 directs the unabsorbed primary light and the secondary light in a general direction indicated by arrow 26 as output light. Thus, the output light is a composite light that is composed of the primary light emitted from die 12 and the secondary light emitted from the wavelength-converting layer 20. The wavelength-converting material may also be configured such that very little or none of the primary light escapes the device, as in the case of a die that emits UV primary light combined with one or more wavelength-converting materials that emit visible secondary light.

As III-nitride LEDs are operated at higher power and higher temperature, the transparency of the organic encapsulants used in layer 20 tends to degrade, undesirably reducing the light extraction efficiency of the device and potentially altering the appearance of the light emitted from the device.

Several alternative configurations of wavelength-converting materials have been proposed, such as growth of LED devices on single crystal luminescent substrates as described in U.S. Pat. No. 6,630,691, thin film phosphor layers as described in U.S. Pat. No. 6,696,703, and conformal layers deposited by electrophoretic deposition as described in U.S. Pat. No. 6,576,488 or stenciling as described in U.S. Pat. No. 6,650,044. Each of these alternative configurations also has disadvantages. Phosphor layers that include binding materials, such as phosphors deposited by electrophoretic deposition or stenciling, may suffer from the same degradation in transparency of the binder materials as described above in reference to FIG. 1. Thin film or conformal phosphor layers can be difficult to handle because the phosphor layers tend to be fragile. One major disadvantage of some prior solutions is the optical heterogeneity of phosphor/encapsulant systems, which leads to scattering, potentially causing losses in conversion efficiency.

SUMMARY

In accordance with embodiments of the invention, a semiconductor structure including a light emitting layer disposed between an n-type region and a p-type region is optically coupled to a compound substrate including a host and a ceramic layer including a luminescent material. In some embodiments the compound substrate includes a crystalline seed layer on which the semiconductor structure is grown. The ceramic layer is disposed between the seed layer and the host. In some embodiments, the compound substrate is attached to the semiconductor structure after growth of the semiconductor structure on a conventional growth substrate. In some embodiments, the compound substrate is spaced apart from the semiconductor structure. The ceramic layer may have a thickness less than 500 µm. The light emitting layer is configured to emit light having a first peak wavelength when forward biased, and the luminescent material is capable of absorbing the light emitted by the light emitting layer and emitting light of a second peak wavelength.

The ceramic layer including the luminescent material may be translucent or transparent, which may reduce the scattering loss associated with non-transparent wavelength converting layers such as conformal layers. Luminescent ceramic layers may also be more robust and easier to handle than prior art wavelength converting layers.

DETAILED DESCRIPTION

Figure 1:
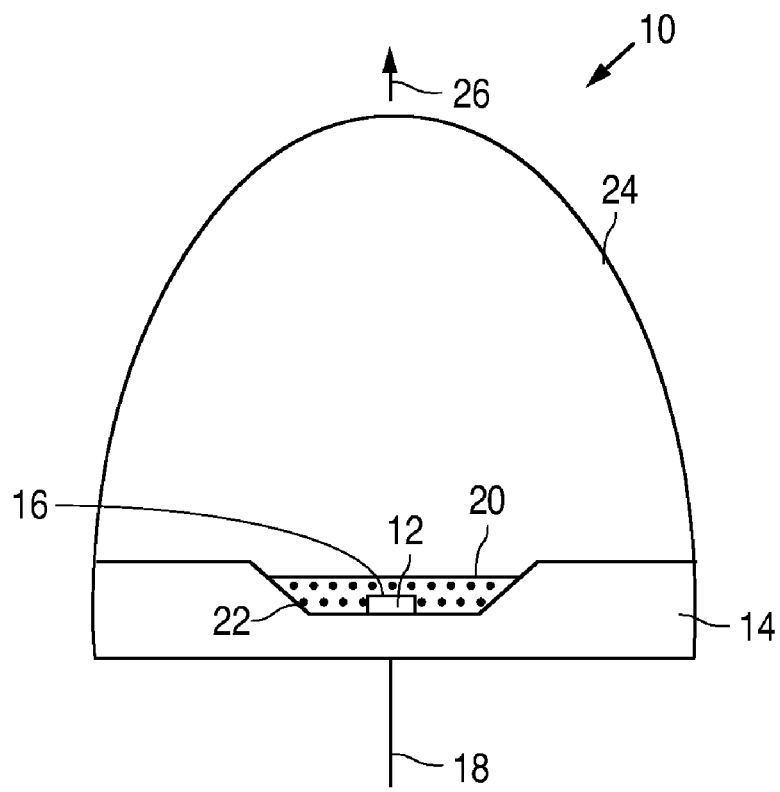
FIG. 1 illustrates a prior art phosphor-converted semiconductor light emitting device.

U.S. patent application Ser. No. 10/861,172, titled "Luminescent Ceramic for a Light Emitting Device," filed Jun. 3, 2004 and incorporated herein by reference describes wavelength converting materials such as phosphors formed into ceramic slabs, referred to herein as "luminescent ceramics," "ceramic layers" or "ceramic phosphors." The ceramic slabs may be self-supporting layers formed separately from the semiconductor device, then attached to the finished semiconductor device or used as a growth substrate for the semiconductor device. The ceramic layers may be translucent or transparent, which may reduce the scattering loss associated with non-transparent wavelength converting layers such as conformal layers. Luminescent ceramic layers may be more robust than thin film or conformal phosphor layers. In addition, since luminescent ceramic layers are solid, it may be easier to make optical contact to additional optical elements such as lenses and secondary optics, which are also solid.

Examples of phosphors that may be formed into luminescent ceramic layers include aluminum garnet phosphors with the general formula $(Lu_{1-x-y-a-b}Y_xGd_y)_3(Al_{1-z-c}Ga_zSi_c)_5O_{12-c}N_c:Ce_aPr_b$ wherein $0<x<1$, $0<y<1$, $0<z\leq 0.1$, $0<a\leq 0.2$, $0<b\leq 0.1$, and $0<c<1$ such as $Lu_3Al_5O_{12}:Ce^{3+}$, $Y_3Al_5O_{12}:Ce^{3+}$ and $Y_3Al_{4.8}Si_{0.2}O_{11.8}N_{0.2}:Ce^{3+}$ which emit light in the yellow-green range; and $(Sr_{1-x-y}Ba_xCa_y)_{2-z}Si_{5-a}Al_aN_{8-a}O_a:EU_z^{2+}$ wherein $0\leq a<5$, $0<x\leq 1$, $0\leq y\leq 1$, and $0<z\leq 1$ such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_xN_yO_z:Eu_a^{2+}$ (a=0.002–0.2, b=0.0–0.25, c=0.0–0.25, x=1.5–2.5, y=1.5–2.5, z=1.5–2.5) including, for example, $SrSi_2N_2O_2:Eu^{2+}$; $(Sr_{1-u-v-x}Mg_uCa_vBa_x)(Ga_{2-y-z}Al_yIn_zS_4):EU^{2+}$ including, for example, $SrGa_2S_4:Eu^{2+}$; $(Sr_{1-x-y}Ba_xCa_y)_2SiO_4:EU^{2+}$ including, for example $SrBaSiO_4:Eu^{2+}$; $(Ca_{1-x}Sr_x)S:Eu^{2+}$ wherein $0\leq x\leq 1$ including, for example, $CaS:Eu^{2+}$ and $SrS:Eu^{2+}$; $(Ca_{1-x-y-z}Sr_xBa_yMg_z)_{1-n}(Al_{1-a+b}B_a)Si_{1-b}N_{3-b}O_b:RE_n$, wherein $0\leq x\leq 1$, $0\leq y\leq 1$, $0\leq z\leq 1$, $0\leq a\leq 1$, $0\leq b\leq 1$ and $0.002\leq n\leq 0.2$ and RE is selected from europium(II) and cerium(III) including for example $CaAlSiN_3:Eu^{2+}$ and $CaAl_{1.04}Si_{0.96}N_3:Ce^{3+}$; and $M_x^{v+}Si_{12-(m+n)}Al_{m+n}O_nN_{16-n}$, with x=m/v and M being a metal, preferably selected out of the group comprising Li, Mg, Ca, Y, Sc, Ce, Pr, Nf, Sm, Eu, Gd, Tb, Dy, Ho, Er, Tm, Yb, Lu or mixtures thereof including, for example, $Ca_{0.75}Si_{8.625}Al_{3.375}O_{1.375}N_{0.625}:Eu_{0.25}$.

A ceramic phosphor may be formed by heating a powder phosphor at high temperature until the surfaces of the phosphor particles begin to soften and a liquid surface layer forms. The partially-melted particle surfaces promote interparticle mass transport which leads to the formation of a "neck" where the particles join. The redistribution of the mass that forms the neck causes shrinkage of the particles during sintering and produces a rigid agglomerate of particles. Uniaxial or isostatic pressing steps, and vacuum sintering of the preformed "green body" or the sintered predensified ceramic may be necessary to form a polycrystalline ceramic layer with low residual internal porosity. The translucency of the ceramic phosphor, i.e. the amount of scattering it produces, may be controlled from high opacity to high transparency by adjusting the heating or pressing conditions, the fabrication method, the phosphor particle precursor used, and the suitable crystal lattice of the phosphor material. Besides phosphor, other ceramic forming materials such as alumina may be included, for example to facilitate formation of the ceramic or to adjust the refractive index of the ceramic. Polycrystalline composite materials that contain more than one crystalline component or a combination of crystalline and amorphous or glassy components can also be formed, for example, by cofiring two individual powder phosphor materials such as an oxonitridosilicate phosphor and a nitridosilicate phosphor.

Unlike a thin film, which optically behaves as a single, large phosphor particle with no optical discontinuities, a luminescent ceramic behaves as tightly packed individual phosphor particles, such that there are small optical discontinuities at the interface between different phosphor particles. Thus, luminescent ceramics are optically almost homogenous and have the same refractive index as the phosphor material forming the luminescent ceramic. Unlike a conformal phosphor layer or a phosphor layer disposed in a transparent material such as a resin, a luminescent ceramic generally requires no binder material (such as an organic resin or epoxy) other than the phosphor itself, such that there is very little space or material of a different refractive index between the individual phosphor particles. As a result, a luminescent ceramic is transparent or translucent, unlike a conformal phosphor layer.

U.S. patent application Ser. No. 11/080,801, titled "Wavelength-Converted Semiconductor Light Emitting Device," filed Mar. 14, 2005 and incorporated herein by reference describes using a luminescent ceramic as a host substrate in a compound substrate on which the III-nitride device layers may be grown.

Figure 2:
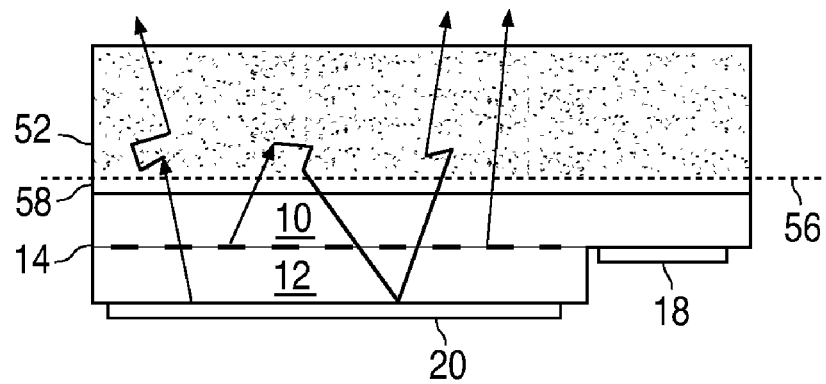
FIG. 2 is a cross sectional view of a semiconductor light emitting device grown on a compound substrate including a luminescent ceramic.

Such a device is illustrated in FIG. 2. A luminescent ceramic 52 is bonded to a nucleation structure 58 by a bond 56 at the interface between the nucleation structure 58 and the luminescent ceramic, either directly by wafer bonding or through an intermediate bonding layer (not shown). If a bonding layer is used, the bonding layer preferably has an index of refraction between the indices of refraction of the III-nitride layer to which the bonding layer is applied and the luminescent ceramic, though bonding layers with lower indices of refraction may be used. Epitaxial layers including a light emitting region 14 disposed between an n-type region 10 and a p-type region 12 are then grown on the nucleation structure. A portion of light emitting region 14 and p-type region 12 are etched away to expose a portion of n-type region 10 on which an n-contact 18 is formed. A reflective p-contact 20 is formed on the remaining portion of p-type region 12, such that all light emission is directed toward the ceramic phosphor. An optional reflector (not shown) such as a distributed Bragg reflector may be provided on the surface of the ceramic phosphor opposite the III-nitride device layers, to control the amount of emission from the active region that escapes the ceramic phosphor unconverted. As an alternative to a reflector, the surface of ceramic phosphor 52 opposite the device layers may be roughened, textured, or shaped to improve light extraction.

The luminescent ceramic 52 of FIG. 2 must be relatively thick, for example, greater than 500 µm thick, to provide the mechanical rigidity necessary for growth of device layers 10, 12, and 14 and for subsequent wafer fabrication processes. Forming such a thick ceramic phosphor may require high pressure, high temperature treatment to form the ceramic, then grinding and polishing, all of which can be expensive processes.

In accordance with embodiments of the invention, the III-nitride device layers of a semiconductor light emitting device are connected to a compound substrate including a luminescent ceramic and a host. The luminescent ceramic layer may be thin, for example, 200 µm thick or less. In some embodiments of the invention, the compound substrate is the growth substrate on which the device layers are grown. In some embodiments of the invention, the compound substrate is attached to the device layers after growth of the device layers on a conventional growth substrate.

Figure 3:
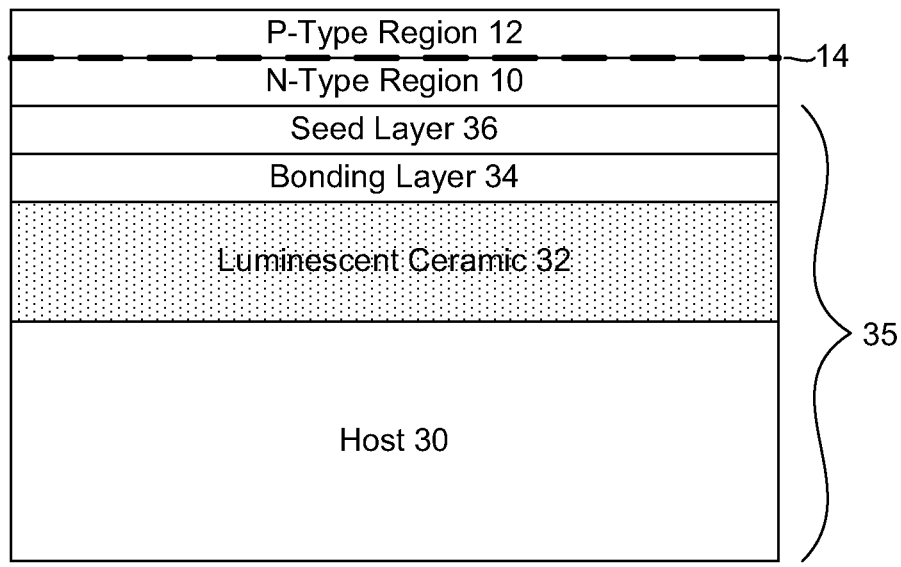
FIG. 3 is a cross sectional view of a semiconductor light emitting device grown on a compound substrate including a luminescent ceramic, according to embodiments of the invention.

FIG. 3 illustrates a first embodiment of the invention, where the compound substrate is used as a growth substrate for growing the III-nitride device layers. In the device of FIG. 3, a luminescent ceramic layer 32 is attached to a host 30 in a compound growth substrate 35. Luminescent ceramic layer 32 may have a thickness between 1 and 500 µm, between 5 and 250 µm, or between 5 and 50 µm. Using a compound substrate including both a luminescent ceramic and a host has the advantage that desired host properties can be separated from desired luminescent properties. For example, host 30 may be sapphire, and luminescent ceramic layer 32 may be highly doped and correspondingly thin, on the order of a few microns. The increased doping level results in a large imaginary component of the refractive index of the luminescent ceramic layer, which may increase the amount of light extracted from the device into the luminescent ceramic by spoiling total internal reflection. Luminescent ceramic layer 32 may be thin and highly doped because mechanical support for the device is provided by host 30. Without host 30, luminescent ceramic layer 32 must be thick enough to provide this mechanical support, and as a result cannot be as highly doped.

Host 30 may be any material that can withstand the conditions required to grow device layers on substrate 35 and to process the device after growth. To minimize deviations from planarity in compound substrate 35, in some embodiments the thickness of host 30 is at least ten times the thickness of luminescent ceramic layer 32. Host 30 provides mechanical support to luminescent ceramic 32 and to the semiconductor device layers grown over substrate 35. In embodiments where host 30 remains part of the device, host 30 may be at least partially transparent if light is extracted from the device through it. Any material able to withstand the processing conditions of the epitaxial layers in the device may be suitable in embodiments of the invention, including semiconductors, ceramics, and metals. Suitable materials include single crystal and polycrystalline $Al_2O_3$, AlN, Si, SiC, AlON, SiAlON, $MgAl_2O_4$, single crystal and ceramic $Y_3Al_5O_{12}$, and metals such as Mo.

Seed layer 36 is the layer on which device layers 10, 12, and 14 are grown, thus it must be a material on which the semiconductor material, III-nitride material in some embodiments, can nucleate. Seed layer 36 is often between about 50 Å and 1 µm thick. In some embodiments seed layer 36 is CTE-matched to the material of the device layers, and is generally a single crystal material that is a reasonably close lattice-match to the device layers. Often the crystallographic orientation of the top surface of seed layer 36 on which the device layers are grown is the wurtzite [0001] c-plane. In embodiments where seed layer 36 remains part of the finished device, seed layer 36 may be transparent or thin if light is extracted from the device through it. Suitable materials include GaN, 4H SiC, 6H SiC, $ScMgAlO_4$, ZnO, $Al_2O_3$, AlGaN, and InGaN.

One or more optional bonding layers 34 may be used to bond luminescent ceramic 32 to seed layer 36. Bonding layer 34 may be between about 100 Å and 1 µm thick. Examples of suitable bonding layers including $SiO_x$ such as $SiO_2$, $SiN_x$ such as $Si_3N_4$, $HfO_2$, mixtures thereof, metals such as Mo, Ti, TiN, other alloys, and other semiconductors or dielectrics. Since bonding layer 34 connects luminescent ceramic layer 32 to seed layer 36, the material forming bonding layer 34 is selected to provide good adhesion between luminescent ceramic 32 and seed 36. In embodiments where bonding layer 34 remains part of the finished device, bonding layer 34 is preferably transparent or very thin. In some embodiments, bonding layer 34 may be omitted, and seed layer 36 may be adhered directly to luminescent ceramic 32.

The device layers including n-type region 10, p-type region 12, and light emitting region 14 are conventional III-nitride device layers grown by growth techniques known in the art. Each of n-type region 10, p-type region 12, and light emitting region 14 may include multiple layers of different compositions and dopant concentration. For example, n-type region 10 and/or p-type region 12 may include preparation layers such as buffer layers or nucleation layers which may be doped or not intentionally doped, release layers designed to facilitate later release of a growth substrate or thinning of the semiconductor structure after substrate removal, and device layers designed for particular optical or electrical properties desirable for the light emitting region to efficiently emit light. Light emitting region 14 may include one or more thick or thin light emitting layers. Examples of suitable light emitting regions include a light emitting region including a single thick light emitting layer, and a multiple quantum well light emitting region including multiple thin quantum wells separated by barrier layers. The composition of the semiconductor layer adjacent to seed layer 36 may be chosen for its lattice constant or other properties, and/or for its ability to nucleate on the material of seed layer 36.

Figure 4:
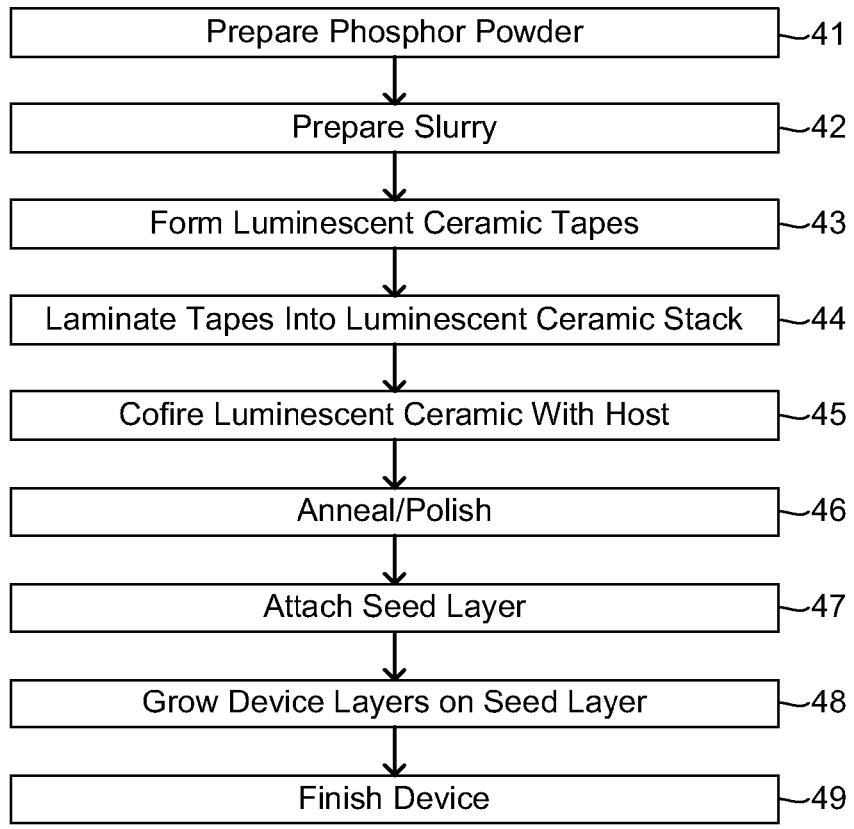
FIG. 4 illustrates a method of forming the device illustrated in FIG. 3.

The device illustrated in FIG. 3 may be formed by the method described in FIG. 4. In stage 41, at least one precursor phosphor powder is prepared. The precursor phosphor powder is a material that can form a phosphor capable of absorbing light of a wavelength emitted by the light emitting layer of the to-be-grown semiconductor light emitting device and emitting light of a different wavelength. In some embodiments, the precursor phosphor powder contains non-reacted precursor powders that react to form a phosphor in a later step such as in cofiring step 45, described below.

In stage 42, a ceramic slurry is prepared from each of the precursor phosphor powders. Each ceramic slurry is then processed into a ceramic tape in stage 43 by casting a thin layer of slurry, which may be an aqueous or organic dispersion of the precursor phosphor powder and/or non-luminescent material and various additives, on a structure such as a metal belt. The slurry layer is then dried, for example using infrared heating and air convection.

Multiple ceramic tapes may be laminated together to form a stack in optional stage 44, for example by thermopressing in a direction perpendicular to the plane of the laminated tapes. Different ceramic tapes in the stack may have differing optical and/or mechanical characteristics including emission spectrum, scattering parameters, and transmission, depending on the starting materials, composition, and processing. For example, different ceramic tapes may contain luminescent materials that emit different colors of light or multiple luminescent materials that emit multiple colors of light, and some ceramic tapes may not contain luminescent materials.

A single tape or laminated stack may be notched or punched to accommodate other structures or functional elements, or to form a structure that can be assembled, then snap-broken into individual devices.

Stages 41-44 result in a tape-cast ceramic green body in the form of a single tape or a laminated stack. One particular example of a YAG:Ce ceramic green body may be formed as follows: A YAG powder doped with 2% Ce with a mean particle diameter of at least 0.2 μm is prepared by mixing $Al_2O_3$, $Y_2O_3$ and $CeO_2$ powders with high purity alumina balls in ethanol for 4 hours. The milled slurry is then dried and fired at 1300° C. in a reducing atmosphere. The obtained powder is then milled again in ethanol containing 0.5 weight-% tetraethoxysilane with high purity alumina balls for 6 hours. After drying, the ceramic powder is again dispersed into demineralized water. The solid content of the slurry is adjusted to 66 weight-%. After sieving the slurry, a binder solution, a suitable plasticizer, wetting agent and antifoam agent are added to form a slip, i.e. a ceramic slurry of powder and solvent with the binder system added, as specified in Table 1 below. As a binder, polyvinyl alcohol having a mean molecular weight of 195 kg/mol, corresponding to a weight average degree of polymerization of 4300 and a hydrolysis ratio of 98.4% is used. Alternatively an organic binder system can be used for slip preparation, for example a binder system with an ethanol/toluene solvent mix, polyvinylbutyral as a binder, Menhaden fish oil as a deflocculant, polyethyleneglycol and dioctylphtalate as plasticizers.

TABLE 1

| Slip recipe used to produce YAG:Ce ceramic tapes | |
|---|---|
| Material | Content [g] |
| YAG:Ce (2%) powder | 1000 |
| Polyvinyl alcohol (Mowiol 56/98, Hoechst) | 433 |
| Demineralized water | 340 |
| Triethylene glycol (Merck) | 26.7 |
| Tripropylene glycol n-butylether (Dow) + 8 wt % Servoxyl VPNZ9/100 (Servo B.V.) | 3.33 |
| Sermul (25%) (Servo B.V.) | 3.33 |
| Triton CF32 (Rohm & Haas) | 0.42 |

The slip is then degassed in vacuum to prevent holes in the tape caused by enclosed air bubbles. Green tapes with a green thickness of 45 μm are casted on glass plates with a batch doctor blade machine. The wet slip layers are subsequently dried in a furnace at 60° C. for 30 min.

Returning to FIG. 4, in stage 45, the ceramic green body is placed adjacent to a host, then cofired, for example by means of vacuum sintering, pressureless sintering, or uniaxial hot pressing, to attach the luminescent ceramic to the host. For example, a YAG:Ce ceramic green body may be stacked with a sapphire host material, the ceramic binder burned out in air at 500 to 600° C., then the stack transferred into a pressing die. The stack is then vacuum hot pressed at 1500 to 1800° C. for 2 to 12 hrs. After hot pressing the cofired stack is postannealed in air at 1350° C. for 2 to 12 hrs.

Since the host and the ceramic green body are cofired together, no costly polishing of the contact surfaces prior to cofiring is needed because grain growth and crystallite rearrangement of the ceramic green body during cofiring leads to a large contact area between the luminescent ceramic and the host. The contact area during sintering and the final bond strength between the luminescent ceramic and the host can be enhanced by applying uniaxial pressure perpendicular to the contact surfaces during cofiring.

In stage 46, after cofiring, the bonded luminescent ceramic and host may be optionally further processed to improve the mechanical and optical properties of the structure, for example by annealing or surface polishing.

Figure 5:
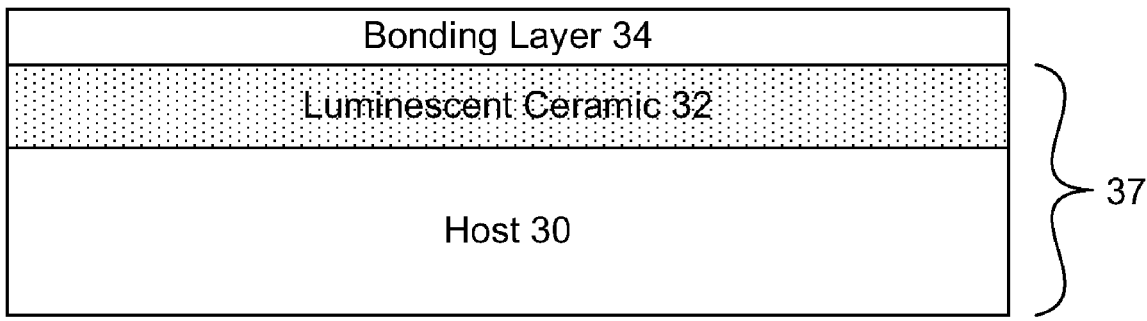
FIG. 5 illustrates a host, luminescent ceramic, and bonding layer.
Figure 6:
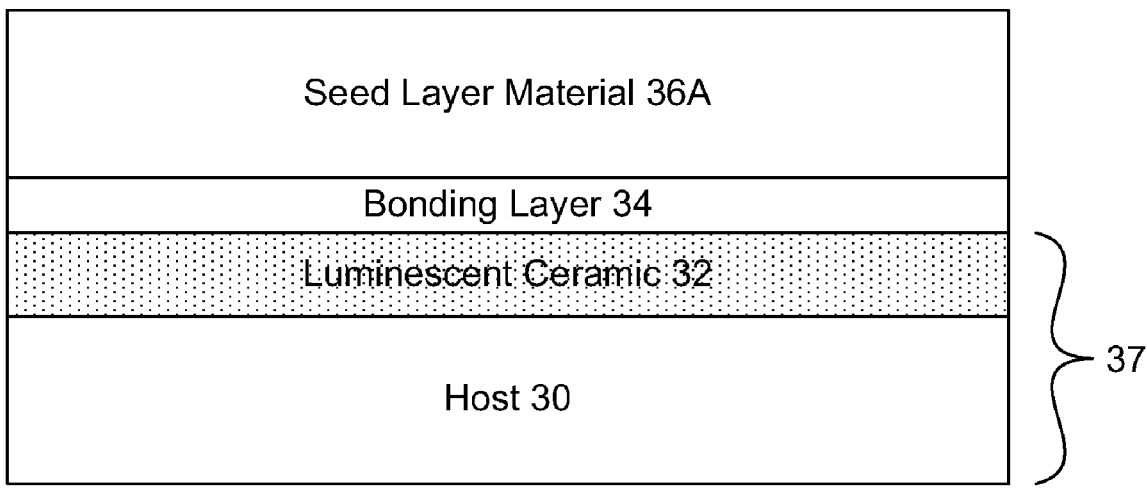
FIG. 6 illustrates the structure of FIG. 5 bonded to a thick wafer of seed layer material.
Figure 7:
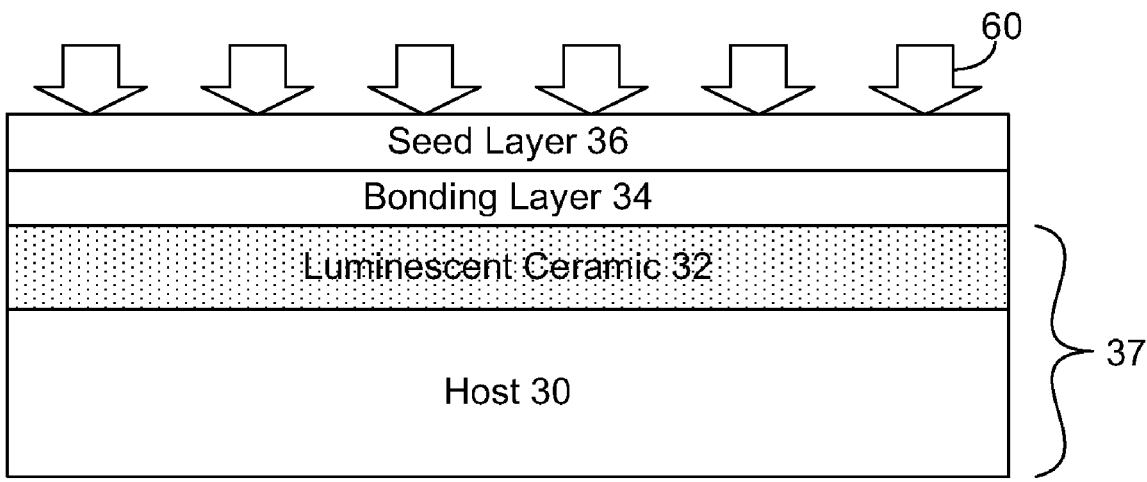
FIG. 7 illustrates a compound substrate after removing a portion of a thick wafer of seed layer material to leave a seed layer of desired thickness.

In stage 47, a seed layer is attached to the bonded luminescent ceramic and host. Seed layer 36 of FIG. 3 may be attached as illustrated in FIGS. 5-7. FIGS. 5-7 illustrate attaching a seed layer when bulk material for the seed layer is readily available; for example, substrates with seed layers of SiC, $Al_2O_3$, ZnO, and possibly some III-nitride layers such as AlN. As illustrated in FIG. 5, bonding layer 34 is formed on the bonded luminescent ceramic/host structure 37 by a conventional technique suitable to the bonding layer and the luminescent ceramic. For example, a $SiO_2$ bonding layer 34 may be deposited on luminescent ceramic 32 by, for example, a deposition technique such as chemical vapor deposition. In some embodiments, bonding layer 34 may be treated after deposit by a technique to make bonding layer 34 flat, such as mechanical polishing.

A thick wafer of seed layer material 36A is then bonded to the exposed surface of bonding layer 34, as illustrated in FIG. 6. Seed layer material wafer 36A must also be flat in order to form a strong bond to bonding layer 34. Structure 37 and wafer 36A are bonded at elevated temperature and pressure perpendicular to the contact surfaces of structure 37 and wafer 36A.

The portion of seed layer material 36A beyond the desired thickness of seed layer 36 is then removed by a technique 60 appropriate to the composition of seed layer 36 as illustrated in FIG. 7. For example, $Al_2O_3$ seed layer material may be removed by grinding and SiC seed layer material may be removed by etching. The resulting structure is the compound substrate 35 described above in reference to FIG. 3.

In devices that include seed layers of materials that are not readily available as bulk material, the seed layer must be prepared separately, for example, in the case of III-nitride seed layers such as GaN, AlGaN, InGaN, InN, and AlN, grown on a suitable growth substrate such as sapphire by an epitaxial technique such as MOCVD or MBE. After growth of seed layer material of appropriate thickness on a growth substrate, the seed layer may be attached to the luminescent ceramic and the growth substrate removed by a technique appropriate to the growth substrate, such as, for example, laser lift off for removal of a $Al_2O_3$ growth substrate or etching for removal of a SiC growth substrate.

Returning to FIG. 4, in stage 48 semiconductor device layers including n-type region 10, light emitting region 14, and p-type region 12 shown in FIG. 3 are grown on the finished compound substrate.

Figure 8:
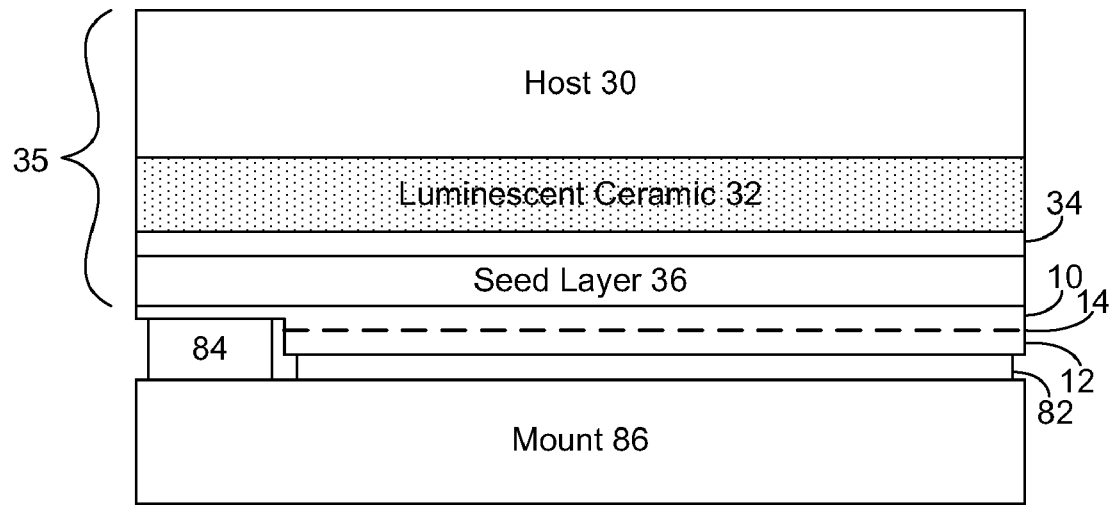
FIG. 8 illustrates a semiconductor light emitting device according to embodiments of the invention.

In stage 49, the semiconductor structure is processed into a finished device, for example by adding electrical contacts, dicing a wafer of devices into individual dice, and packaging the dice. In some embodiments, host 30 may be thinned prior to dicing, for example to a thickness less than 200 µm. FIG. 8 illustrates a flip chip device after processing. A portion of p-type region 12 and light emitting region 14 are removed such that portions of both the n-type region and the p-type region sandwiching the light emitting layer are exposed on the same side of the device. Electrical contacts 82 and 84 are formed on these exposed portions. If electrical contacts 82 and 84 are reflective, the structure may be mounted contacts-side-down on a mount 86 such that light is extracted through seed layer substrate 35 as illustrated in FIG. 8. If electrical contacts 82 and/or 84 are transparent, the device may be mounted contacts-side-up such that light is extracted through the contacts (not shown in FIG. 8).

Figure 9:
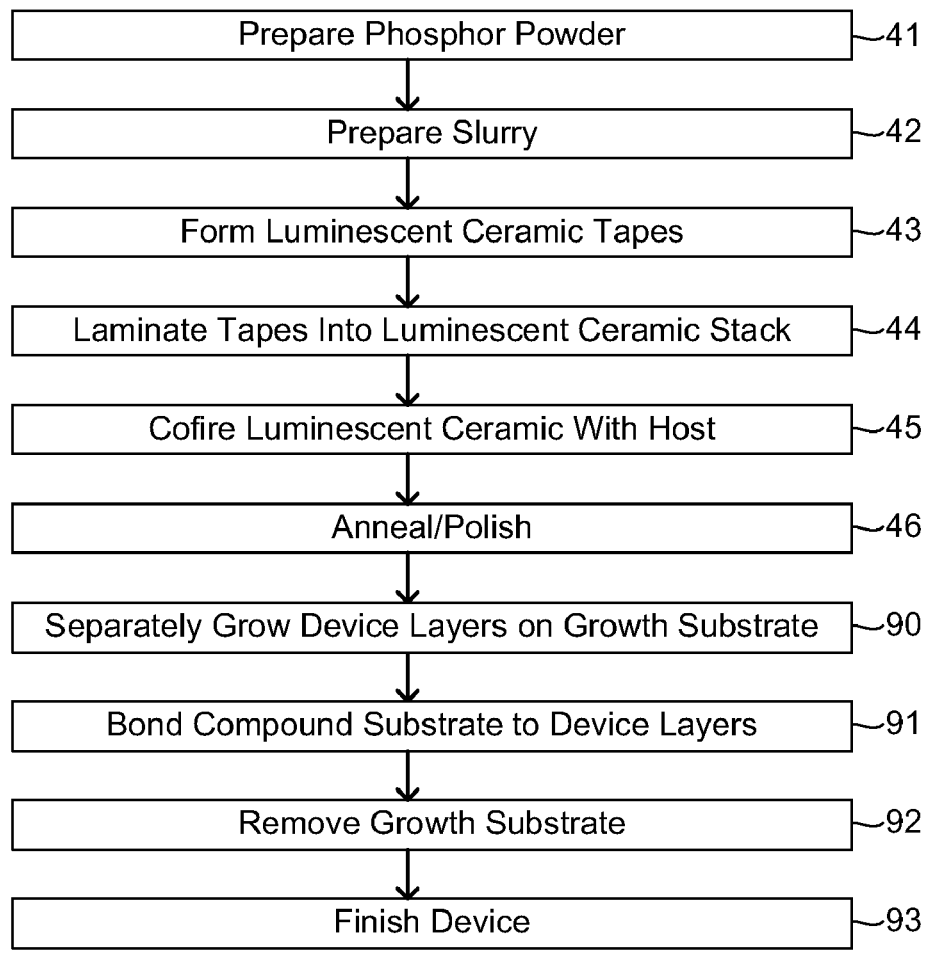
FIG. 9 illustrates a method of forming the device illustrated in FIG. 11.
Figure 10:
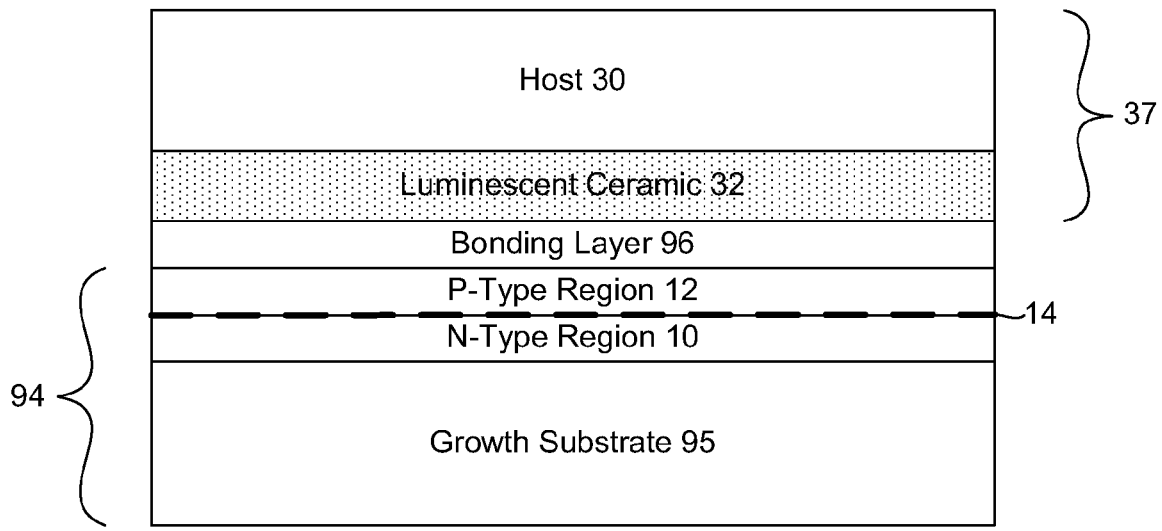
FIG. 10 is a cross sectional view of semiconductor device layers grown on a growth substrate and bonded to a compound substrate including a luminescent ceramic, according to embodiments of the invention.
Figure 11:
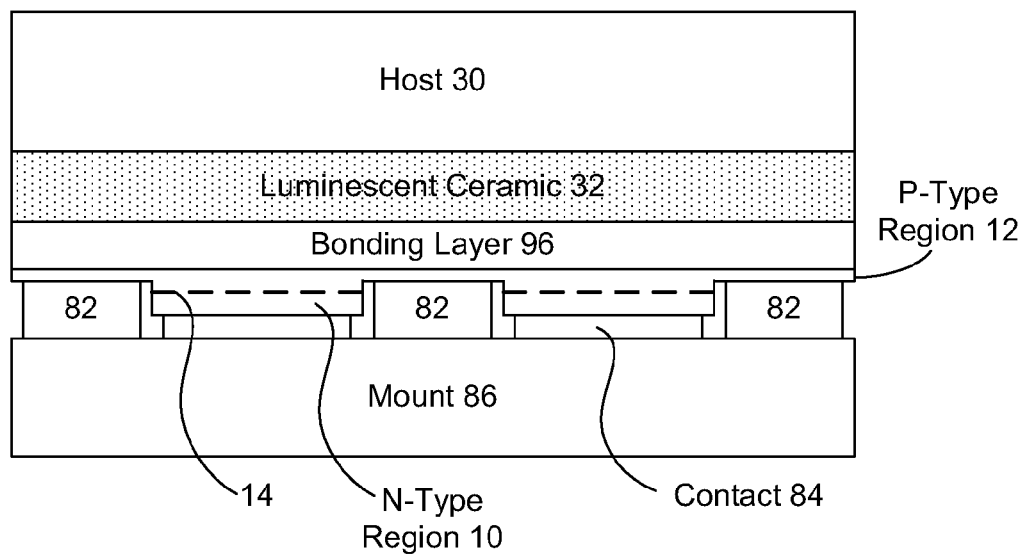
FIG. 11 illustrates a semiconductor light emitting device according to embodiments of the invention.

FIG. 11 illustrates an alternate embodiment of the invention where the compound substrate does not include a seed layer and is attached to the device layers after growth of the device layers on a conventional growth substrate. FIG. 9 illustrates a method of forming the device of FIG. 11. Luminescent ceramic 32 is prepared and attached to host 30 in stages 41-46 as described above in reference to FIG. 4. In stage 90, device layers including an n-type region 10, an active region 14, and a p-type region 12 are grown separately on a suitable growth substrate 95 such as $Al_2O_3$, SiC, or GaN, resulting in structure 94 shown in FIG. 10.

In stage 91 of FIG. 9, compound substrate 37, which includes host 30 and luminescent ceramic 32, is attached to the top surface of structure 94, the surface of p-type region 12 in FIG. 10. An optional bonding layer 96 may be formed between luminescent ceramic 32 and p-type region 12.

In stage 92 of FIG. 9, growth substrate 95 may be removed by a technique suitable to the growth substrate. Compound substrate 37 provides mechanical support to device layers 10, 12, and 14 during growth substrate removal. After growth substrate 95 is removed, the surface of n-type region 10 is exposed. The structure is then processed into a finished device in stage 93. Portions of n-type region 10 and active region 14 may be removed to expose one or more portions of p-type region 12. Electrical contacts 82 and 84 are formed on the exposed portions of p-type region 12 and the remaining portions of n-type region 10. In some embodiments, since current spreads more readily through n-type III-nitride layers than through p-type III-nitride layers, structure 94 is grown such that p-type region 12 is grown first on growth substrate 95, followed by light emitting region 14 and n-type region 10. In such a device, in the orientation shown in FIG. 11, p-type region 12 would be below n-type region 10, such that contacts 82 connect to n-type region 10 and contacts 84 connect to p-type region 12. After the contacts are formed and a wafer of devices is diced into individual dice, one or more dice may be connected to a mount 86 as shown in FIG. 11.

Figure 12:
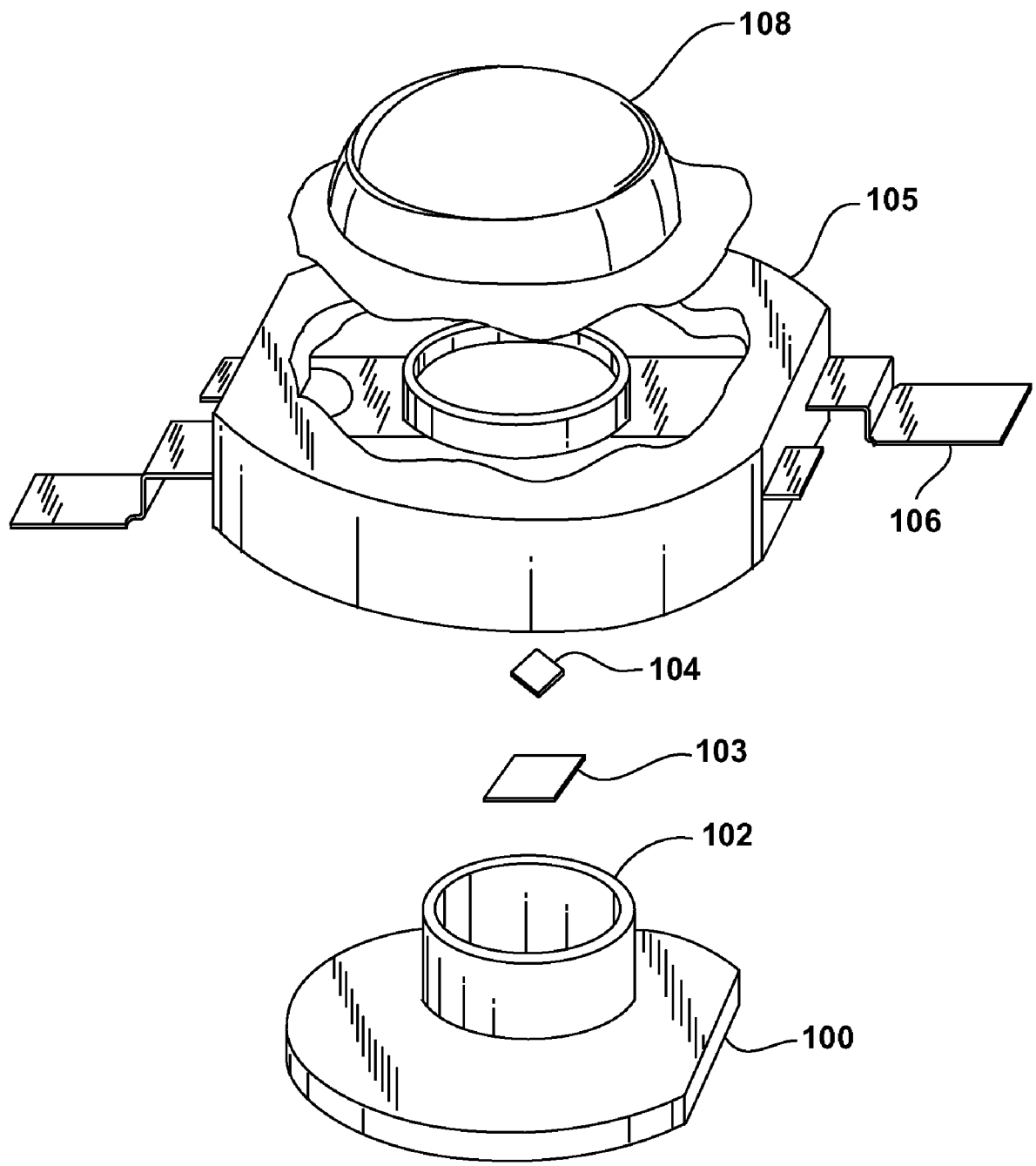
FIG. 12 is an exploded view of a packaged light emitting device.

FIG. 12 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a mount 103 as described above to slug 100. A cover 108, which may be an optical lens, may be added.

In some embodiments, the compound substrate is spaced apart from the semiconductor device layers and does not provide mechanical support to the device layers. For example, in an application such as a projector, a compound substrate including a luminescent ceramic and a host may be used to convert light emitting by the light emitting region of the semiconductor device layers to create white light. Optics such as dichroic filters or light guides may be disposed between the compound substrate and the semiconductor device layers. The refractive index of the host may be selected to improve extraction of the converted light or to absorb the pump light by matching the refractive indices of the luminescent ceramics and the surroundings, for example if the light is extracted in air.

Having described the invention in detail, those skilled in the art will appreciate that, given the present disclosure, modifications may be made to the invention without departing from the spirit of the inventive concept described herein. For example, though the above embodiments describe III-nitride devices, in some embodiments the device layers may be formed from other material systems such as other III-V material systems, such as III-AsP materials. Therefore, it is not intended that the scope of the invention be limited to the specific embodiments illustrated and described.

What is being claimed is:

1. A method comprising:
providing a compound substrate, the compound substrate comprising:
a host; and
a ceramic layer connected to the host, the ceramic layer containing a luminescent material and having a thickness less than 500 µm; and
attaching a semiconductor structure to the compound substrate, the semiconductor structure including a light emitting layer disposed between an n-type region and a p-type region.

2. The method of claim 1 wherein:
the light emitting layer is configured to emit light of a first peak wavelength when forward biased; and
the luminescent material is capable of absorbing light of the first peak wavelength and emitting light of a second peak wavelength.

3. The method of claim 1 wherein attaching comprises growing the semiconductor structure over the compound substrate.

4. The method of claim 3 wherein:
the compound substrate further comprises a seed layer;
the ceramic layer is disposed between the host and the seed layer; and
growing comprises growing the semiconductor structure directly on the seed layer.

5. The method of claim 1 further comprising growing the semiconductor structure on a growth substrate, wherein attaching comprises bonding the semiconductor structure to the ceramic layer.

6. The method of claim 5 further comprising providing a bonding layer disposed between the semiconductor structure and the ceramic layer.

7. The method of claim 5 further comprising removing the growth substrate after bonding.

8. The method of claim 1 further comprising:
forming a first contact electrically connected to the p-type region; and
forming a second contact electrically connected to the n-type region;
wherein the first and second contacts are both formed on a same side of the semiconductor structure.

* * * * *